US009797169B2

(12) United States Patent
Musat

(10) Patent No.: US 9,797,169 B2
(45) Date of Patent: Oct. 24, 2017

(54) PRESENCE SENSOR FOR AN OPENABLE BODY SECTION OF A MOTOR VEHICLE

(71) Applicant: VALEO COMFORT AND DRIVING ASSISTANCE, Creteil (FR)

(72) Inventor: Ciprian Musat, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 0 days.

(21) Appl. No.: 15/105,698

(22) PCT Filed: Dec. 19, 2014

(86) PCT No.: PCT/EP2014/078743
§ 371 (c)(1),
(2) Date: Jun. 17, 2016

(87) PCT Pub. No.: WO2015/091950
PCT Pub. Date: Jun. 25, 2015

(65) Prior Publication Data
US 2016/0326778 A1 Nov. 10, 2016

(30) Foreign Application Priority Data

Dec. 19, 2013 (FR) ..................... 13 03017

(51) Int. Cl.
*G01R 27/26* (2006.01)
*E05B 3/00* (2006.01)
(Continued)

(52) U.S. Cl.
CPC .............. *E05B 81/77* (2013.01); *E05B 81/78* (2013.01); *G01D 5/24* (2013.01); *G01R 27/2605* (2013.01);
(Continued)

(58) Field of Classification Search
CPC ........ G01R 27/00; G01R 27/02; G01R 27/26; G01R 27/2605; G01D 5/24; G01D 5/2405;
(Continued)

(56) References Cited

U.S. PATENT DOCUMENTS 6,075,294 A * 6/2000 Van den Boom ....... E05B 81/78
307/10.1
6,242,927 B1 6/2001 Adams et al.
(Continued)

FOREIGN PATENT DOCUMENTS

DE 10132077 A1 1/2003
FR 2842853 A1 1/2004
(Continued)

OTHER PUBLICATIONS

International Search Report issued in corresponding application No. PCT/EP2014/078743 mailed Oct. 6, 2015 (6 pages).
(Continued)

*Primary Examiner* — Hoai-An D Nguyen
(74) *Attorney, Agent, or Firm* — Osha Liang LLP

(57) ABSTRACT

The present invention relates to a capacitive presence sensor (1) arranged in the gripping lever (L) of a handle of an openable body section (2) of a motor vehicle (V) characterised in that it comprises: a printed circuit (10) including a first surface (101) and a second surface (102), an electrode (E1) including a surface which extends along said first surface (101) and a second electrode (E2) including a surface which extends along said second surface (102); and also in that it comprises: a guard plane (13) made up of a conductive track arranged between the first electrode (E1) and the second electrode (E2), passing through the body (e) of said printed circuit (10) and comprising a first printed surface (130) extending along said first surface (101) of the
(Continued)

printed circuit (10) and a second printed surface (131) extending along said second surface of the printed circuit (10).

8 Claims, 3 Drawing Sheets

(51) Int. Cl.

| | | |
|---|---|---|
| *H03K 17/955* | (2006.01) | |
| *E05B 81/78* | (2014.01) | |
| *G01D 5/24* | (2006.01) | |
| *G06F 3/044* | (2006.01) | |
| *H05K 1/16* | (2006.01) | |
| *H05K 1/02* | (2006.01) | |

(52) U.S. Cl.
CPC .......... *G06F 3/044* (2013.01); *H03K 17/955* (2013.01); *H05K 1/162* (2013.01); *H03K 2217/960765* (2013.01); *H05K 1/025* (2013.01); *H05K 2201/09672* (2013.01); *H05K 2201/10151* (2013.01)

(58) Field of Classification Search
CPC ...... G01D 5/241; G01D 5/2417; G06F 3/044; H03K 17/00; H03K 17/94; H03K 17/945; H03K 17/955; H03K 2217/960765; H05K 1/025; H05K 1/162; H05K 2201/09672; H05K 2201/10151; E05B 81/00; E05B 81/54; E05B 81/64; E05B 81/76; E05B 81/77; E05B 81/78
USPC ....... 324/600, 649, 658, 660, 661, 662, 663, 324/671, 686, 688
See application file for complete search history.

(56) References Cited

U.S. PATENT DOCUMENTS

| | | |
|---|---|---|
| 6,249,130 B1 | 6/2001 | Greer |
| 6,551,138 B2* | 4/2003 | Ruque ................ H01R 13/6594 439/108 |
| 9,176,597 B2* | 11/2015 | Soo .......................... G06F 3/03 |
| 9,298,321 B2* | 3/2016 | Kurashima ............. G06F 3/044 |
| 9,543,948 B2* | 1/2017 | Curtis ................ H03K 17/9622 |
| 2003/0107473 A1 | 6/2003 | Pang et al. |
| 2007/0181412 A1 | 8/2007 | Raunig |
| 2008/0012694 A1* | 1/2008 | Daghan .............. G07C 9/00309 340/426.36 |
| 2011/0148516 A1* | 6/2011 | Tanaka ................. G09G 3/3685 327/564 |
| 2011/0304427 A1 | 12/2011 | Leon et al. |
| 2012/0081328 A1 | 4/2012 | Kandziora et al. |
| 2013/0241578 A1* | 9/2013 | Satake ............... G01R 27/2605 324/661 |
| 2014/0124350 A1* | 5/2014 | Siebert ................. H03K 17/962 200/520 |

FOREIGN PATENT DOCUMENTS

| | | |
|---|---|---|
| GB | 2400666 A | 10/2004 |
| WO | 2013040634 A1 | 3/2013 |

OTHER PUBLICATIONS

Written Opinion of the International Searching Authority issued in corresponding application No. PCT/EP2014/078743 mailed Oct. 6, 2015 (7 pages).

French Search Report issued in corresponding application No. FR1303017 dated Sep. 24, 2014 (8 pages).

* cited by examiner

PRESENCE SENSOR FOR AN OPENABLE BODY SECTION OF A MOTOR VEHICLE

TECHNICAL FIELD OF THE INVENTION

The present invention relates to a capacitive presence sensor which can be arranged in a handle of an opening section of a motor vehicle.

It is applicable in particular, but in a nonlimiting manner, in the field of motor vehicles.

TECHNOLOGICAL BACKGROUND OF THE INVENTION

It is known practice to those skilled in the art to incorporate capacitive presence sensors in the gripping lever of handles of opening sections of motor vehicles.

This makes it possible to detect the presence of an object such as a hand of a user of the motor vehicle when it is about to grasp the gripping lever of the handle in order to open the opening section, and thus to initiate the unlocking of said opening section.

The approach of the finger or of the hand of the user toward the electrode of the capacitive sensor varies its capacitance.

The capacitive sensor is generally linked to a management unit which triggers the locking or the unlocking of the opening section as a function of the information delivered by the electrode, that is to say as a function of the variation of capacitance thereof.

One drawback is that such a capacitive sensor comprises an electrode sensitive to the capacitance value of the environment. Thus, when this sensor is arranged in a gripping lever of a handle which has a decorative conductive element, for example on the outer face of this lever, the sensitivity of the electrode is reduced by the presence of this decorative conductive element. The decorative conductive element thus varies the electrical field of the sensor. When the hand passes over the front face of the gripping lever of the handle, it is then considered to be inside the handle and therefore interpreted as an action of the user to lock or unlock the opening section.

Similarly, in a rain shower, a trickle of water may run over the handle. In this case in point, the capacitance of the electrode varies also and this variation is interpreted wrongly by the management unit as an action by the user to lock or unlock the opening section.

Also, according to another prior art known to those skilled in the art, to remedy these drawbacks, a capacitive presence sensor arranged in the gripping lever of a handle of an opening section of a motor vehicle has been proposed that comprises:
- a first electrode for measuring capacitance defining a first detection zone and a second electrode for measuring capacitance defining a second detection zone;
- a so-called guard plane capable of minimizing a capacitive coupling between said first electrode and said second electrode; and said sensor being linked to a processing unit connected to said first electrode, to said second electrode and to the guard plane, said processing unit being suitable for periodically and alternately setting said guard plane at the same potential as said first electrode or at the same potential as said second electrode.

The two measurement electrodes are arranged at right angles to one another, one being oriented toward the opening section of the vehicle, namely toward the zone where a hand has to be detected, and the second being oriented toward the top part of the gripping lever of the handle, the part which may receive a decorative conductive element.

In order to arrange them at right angles to one another, the second electrode (or lateral electrode) which is a bi-electrode is an add-on part. It consists of a pair of welded metal barrels. Consequently, a signal processing must be performed to make it possible to separate the capacitive information items originating from each of the electrodes.

One drawback with such a capacitive sensor is that it is bulky and that it requires an add-on component which makes it mechanically fragile. Moreover, if the sensor incorporates a low-frequency antenna, the performance thereof is reduced by the spurious effect of the add-on part on the antenna.

In this context, the present invention aims to resolve the abovementioned drawback.

GENERAL DESCRIPTION OF THE INVENTION

To this end, the invention proposes a capacitive presence sensor capable of being arranged in the gripping lever of a handle of an opening section of a motor vehicle comprising:
- a first electrode for measuring capacitance defining a first detection zone and a second electrode for measuring capacitance defining a second detection zone;
- a so-called guard plane suitable for minimizing a capacitive coupling between said first electrode and said second electrode;

said sensor being linked to a processing unit connected to said first electrode, to said second electrode and to the guard plane, said processing unit being suitable for periodically and alternately setting said guard plane at the same potential as said first electrode or at the same potential as said second electrode; said sensor being characterized in that it further comprises:
- a printed circuit comprising a first face and a second face, said first electrode comprising a surface which extends along said first face and said second electrode comprising a surface which extends along said second face;

and in that:
- the guard plane consists of a conductive track arranged between the first electrode and the second electrode passing through the thickness of said printed circuit and comprising a first printed surface extending along said first face of the printed circuit and a second printed surface extending along said second face of the printed circuit.

Thus, as will be seen in detail below, this novel sensor structure without any added part makes it possible to overcome the mechanical problems, and at the same time any undesirable spurious effects on a low-frequency antenna.

According to nonlimiting embodiments, the presence sensor may further comprise one or more additional features out of the following:
- The first surface of the conductive track is of a length at least equal to the length of said second electrode, and the second surface of the conductive track is of a length at least equal to the length of said first electrode.
- The capacitive presence sensor further comprises a second second electrode arranged such that the two second electrodes are situated on either side of the first electrode on a plane at right angles to said presence sensor.
- The first electrode is offset relative to the second electrode on a plane at right angles to said printed circuit so as to obtain detection directions corresponding respectively to the first detection zone and to the second detection zone which are oblique.

The first electrode is adapted to be positioned facing said opening section.

The second electrode is adapted to be positioned facing a conductive element.

There is also proposed a handle of an opening section of a motor vehicle comprising a gripping lever, characterized in that it comprises a presence sensor arranged in said gripping lever, according to any one of the above features.

BRIEF DESCRIPTION OF THE FIGURES

The invention and its various applications will be better understood on reading the following description and examining the accompanying figures.

DESCRIPTION OF EMBODIMENTS OF THE INVENTION

The elements that are identical, by structure or by function, and that appear in the various figures retain, unless stipulated otherwise, the same references.

The capacitive presence sensor 1 arranged in the gripping lever L of a handle of an opening section 2 of a motor vehicle V is illustrated in FIGS. 1 to 4.

Figure 1:
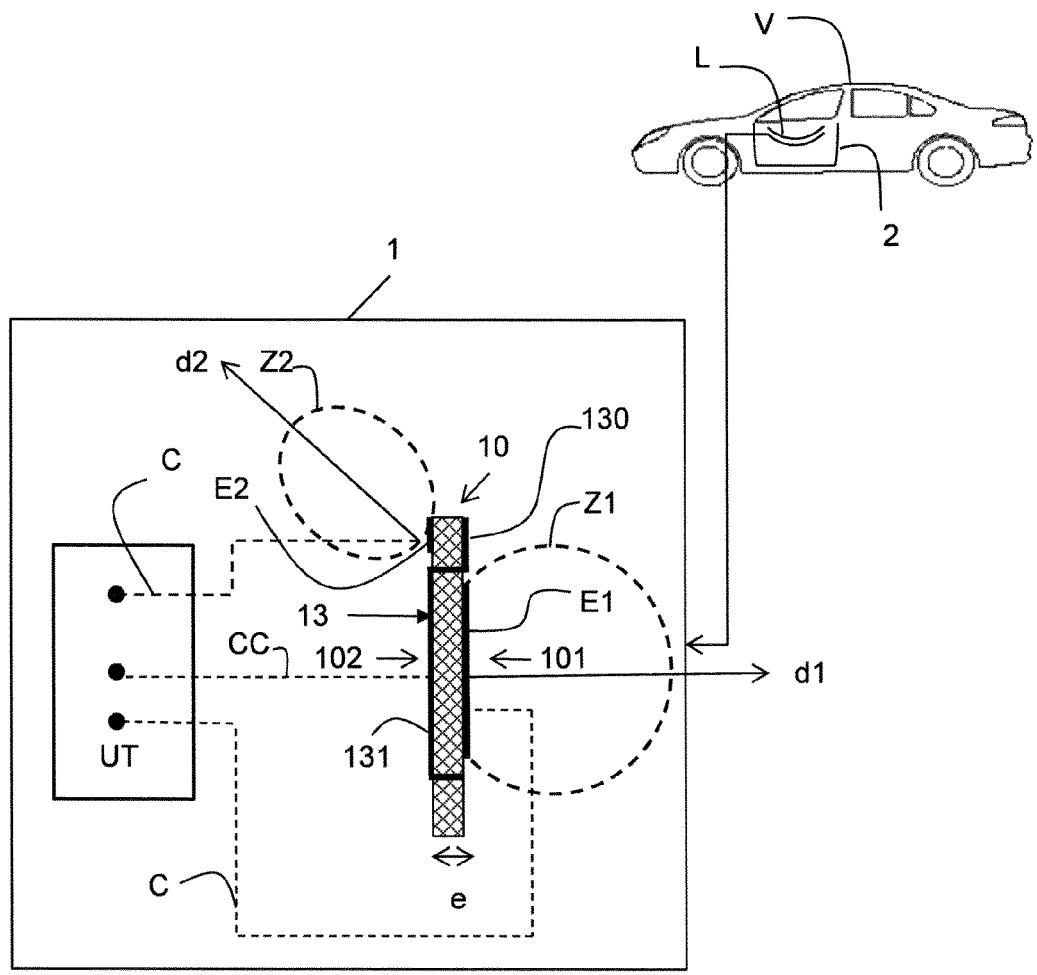
FIG. 1 is a diagram of a capacitive presence sensor arranged in the gripping lever of a handle of an opening section of a motor vehicle according to a first nonlimiting embodiment of the invention.
Figure 2:
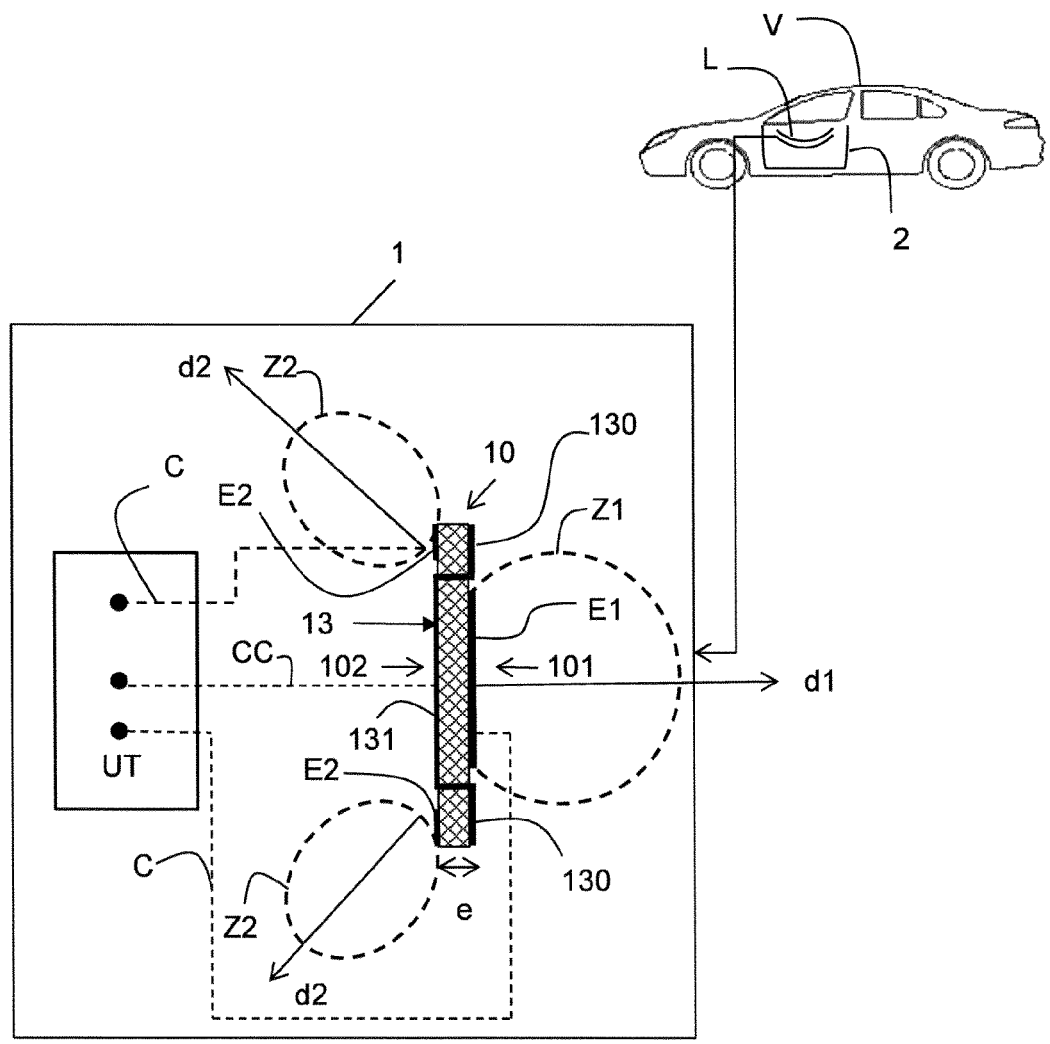
FIG. 2 is a diagram of a diagram of a capacitive presence sensor arranged in the gripping lever of a handle of an opening section of a motor vehicle according to a second nonlimiting embodiment of the invention.

It will be noted that FIGS. 1 and 2 illustrate the capacitive presence sensor 1 by a straight cross-sectional view.

FIG. 1 represents a first nonlimiting embodiment of the capacitive presence sensor 1. According to this embodiment, it comprises:

- a first electrode E1 for measuring capacitance defining a first detection zone Z1 and a second electrode E2 for measuring capacitance defining a second detection zone Z2;
- a printed circuit 10 comprising a first face 101 and a second face 102, said first electrode E1 comprising a surface which extends along said first face 101 and said second electrode E2 comprising a surface which extends along said second face 102. The printed circuit 10 is a PCB (Printed Circuit Board) plate.

The capacitive presence sensor 1 further comprises:

- a so-called guard plane 13 capable of minimizing a capacitive coupling between said first electrode E1 and said second electrode E2.

The capacitive presence sensor 1 is also linked to a processing unit UT of the vehicle V.

This processing unit UT is in particular connected to said first electrode E1, to said second electrode E2 and to the guard plane 13.

The processing unit UT is also suitable for periodically and alternately setting said guard plane 13 at the same potential as said first electrode E1 or at the same potential as said second electrode E2. In a nonlimiting embodiment, the processing unit UT is formed by a microcontroller provided with means for measuring the electrical capacitance of the electrodes. The parameterizing of a microcontroller can be modified simply.

In an alternative embodiment, it is possible to envisage also arranging the processing unit UT in the gripping lever L of a handle of the opening section 2.

The various elements are described in more detail hereinbelow.

As can be seen in FIG. 1, the first electrode E1 and the second electrode E2 are laid respectively on the two faces 102, 101 of the printed circuit 10 which makes it possible to reduce the bulk of the presence sensor 1.

The electrodes E1 and E2 are tracks printed on the printed circuit 10.

In the nonlimiting embodiment of FIG. 1, there is only a single second electrode E2. The first electrode E1 and the second electrode E2 are arranged such that said first zone Z1 and said second zone Z2 are offset in the space. Thus, the first electrode E1 is offset relative to the second electrode E2 on a plane at right angles to said printed circuit 10 so as to obtain detection directions d1, d2 corresponding respectively to the first detection zone Z1 and to the second detection zone Z2 which are oblique. In a nonlimiting embodiment, the directions d1 and d2 are orthogonal to one another.

The first detection zone Z1 corresponds to the zone where the hand will be inserted into the gripping lever L of the handle of the opening section 2, whereas the second detection zone Z2 corresponds to the zone where there may be a conductive element such as a decorative chrome-plated element, namely, for example, the top part (called lateral part) of the gripping lever L of the handle of the opening section 2 (described later in the description). "Detection direction" should be understood to mean a direction in which the gradient of the electrical field is maximum, an electrode E1, E2 establishing magnetic field lines corresponding to a given detection zone. By virtue of the different orientation of the detection directions d1, d2, and of the guard plane, a detection is made within the handle and on its lateral face or faces (above and/or below). The detection zones (internal and facing the chrome-plated element) are therefore clearly differentiated.

The guard plane 13 consists of a conductive track arranged between the first electrode E1 and the second electrode E2. It passes through the thickness e of the printed circuit 10 and comprises a first printed surface 130 which extends along said first face 101 of the printed circuit 10 and a second printed surface 131 which extends along said second face 102 of the printed circuit 10.

In order to perform the so-called guard function, the potential of the conductive track 13 is set at the same level as that of the first electrode E1, or is set at the same level as that of the second electrode E2. This is called active guard plane.

In a nonlimiting embodiment, each electrode E1, E2 is connected to the processing unit UT by means of a single connection C.

Each single connection C alternately forms the measurement input E suitable for measuring the variation of capacitance of the corresponding electrode or the control output S suitable for controlling the potential of the corresponding electrode.

Moreover, the guard plane 13 is connected to the processing unit UT by means of a connection CC. It makes it possible to perform the setting of the potential of the conductive track 13 to the potential of the electrode E1 or of the electrode E2.

Furthermore, the setting of the potential is done periodically and alternately between the first electrode E1 and the second electrode E2, namely to the same potential as the electrode which makes a capacitive signal measurement. The signal measurements are in fact acquired alternately by the electrode E1, then by the electrodes E2. Thus, the presence sensor 1 alternately watches in the direction D1 then in the direction D2. It distinctly recovers each signal measured on E1 and on E2.

In a nonlimiting exemplary embodiment, when the first electrode E1 acquires the capacitive signal, the second electrode E2 is inactive, and when the second electrode E2 acquires the capacitive signal, the first electrode E1 is inactive.

In another nonlimiting example, when the first electrode E1 acquires the capacitive signal, the second electrode E2 is set as output element of the processing unit UT at the same potential as the guard plane 13, namely at the same potential as the first electrode E1.

Similarly, when the second electrode E2 acquires the capacitive signal, the first electrode E1 is set as output element of the processing unit UT at the same potential as the guard plane 13, namely at the same potential as the second electrode E2. This implementation avoids having additional spurious capacitances on the guard plane 13.

It will be noted that the voltage applied to the electrodes E1, E2 is alternating. In a nonlimiting example, the voltage varies between 0 V and 3 V. The guard plane 13 will thus follow the alternating voltage of the electrode to the potential of which it is set.

By virtue of the guard plane 13, the capacitive coupling between the two electrodes E1 and E2 is reduced, and is thus no longer problematical for the capacitive function of the sensor 1. In effect, each electrode E1, E2 will deliver a signal (capacitance value) representative of a hand, or of raindrops, a signal which will no longer have interference from the coupling.

Furthermore, the guard plane prevents the chrome-plated element from influencing the electrical field around the gripping lever L. This element no longer hampers the detection of the hand.

FIG. 2 represents a second nonlimiting embodiment of the capacitive presence sensor 1. According to this embodiment, it further comprises a second second electrode E2 arranged such that the two second electrodes E2 are situated on either side of the first electrode E1 on a plane at right angles to said presence sensor 1. Thus, a second second detection zone Z2 is created. This second zone Z2 is placed facing the bottom part of the gripping lever L and will thus make it possible to detect a hand arriving under said lever. Furthermore, together with the other second electrode E2, that makes it possible to perform a detection in front of the gripping lever L. It will then be possible to detect a hand in front or any other object such as the body, a wall, etc. Finally, by virtue of the symmetrical mounting of the two electrodes E2, the presence sensor 1 can be mounted on a gripping lever L which is located on a left or right car door of the vehicle V.

Figure 3:
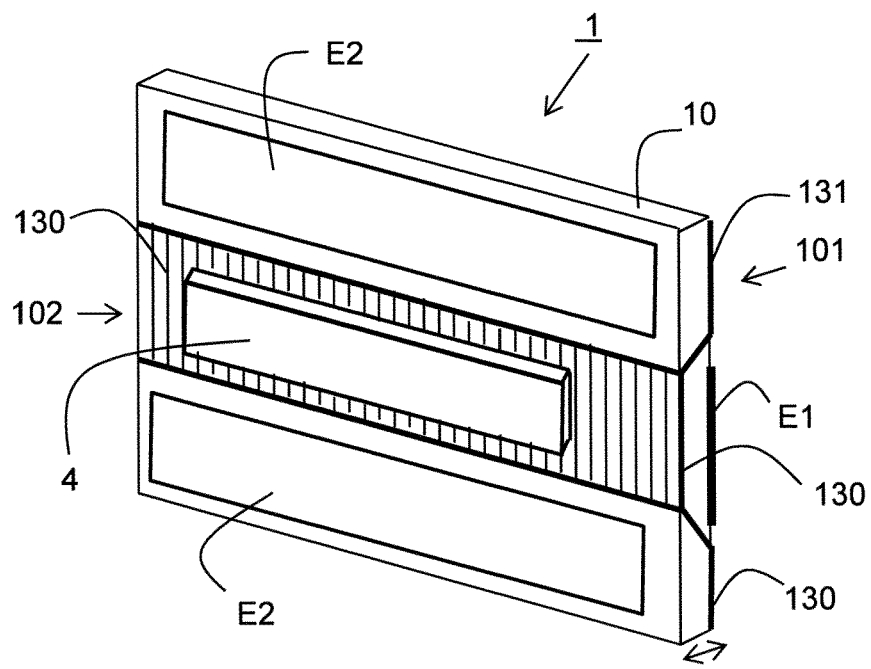
FIG. 3 is a perspective representation of the capacitive presence sensor of FIG. 2 incorporating an antenna.

FIG. 3 is a perspective representation of the presence sensor 1 according to the embodiment presented in FIG. 2 with an incorporated LF antenna. As can be seen in this figure, the two electrodes E2 are arranged flat on the printed circuit 10. The volume of the presence sensor is thus reduced compared to a sensor comprising electrodes arranged perpendicular to said printed circuit 10.

As can be seen in FIG. 3 also, a low-frequency antenna 4 is positioned on the printed circuit 10 in proximity to the electrodes E1 and E2. Such an antenna may be necessary in order to ensure the communication between the sensor 1 and an electronic board suitable for triggering the locking or the unlocking of the opening section 2 of the vehicle V.

By positioning the second electrode or electrodes E2 flat on the printed circuit, it becomes possible to distance them from the LF antenna and thus to no longer short-circuit the electrical waves emitted by the antenna toward the electrodes E2. There is in fact no more metallic part facing and all along the LF antenna. There are therefore no longer any heat losses due to the electrical waves which were transformed into heat as previously.

In order to optimize the guard function, the first surface 130 (illustrated by the horizontal shading lines) of the conductive track 13 is of a length at least equal to the length of said second electrode E2, and the second surface 131 of the conductive track 13 is of a length at least equal to the length of said first electrode E1. In the example taken, they are longer than the electrodes E1, E2.

The detection zones Z1 and Z2 thus do not overlap at all.

Thus the situation in which a signal measured by the electrode E1 interferes with a signal measured by an electrode E2 and vice versa so that it is no longer possible to distinguish the signal originally measured is avoided.

Figure 4:
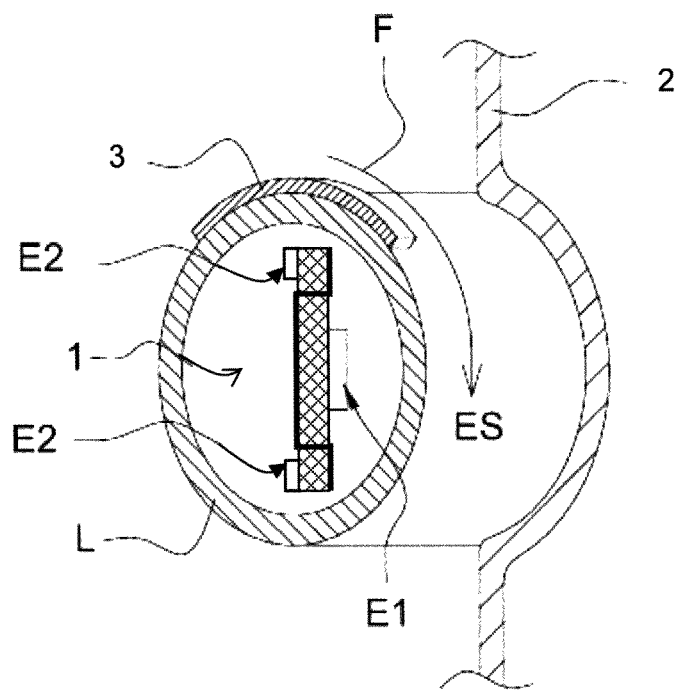
FIG. 4 represents a cross section of an opening section comprising a handle provided with a gripping lever in which is incorporated a capacitive presence sensor according to FIG. 2 or according to FIG. 3.

FIG. 4 illustrates a cross-sectional view of an opening section 2 (door, trunk) of a motor vehicle on which is mounted a handle comprising a gripping lever L. The gripping lever L incorporates the presence sensor 1 according to the second embodiment. To open the opening section 2, in the example taken, the user must pass his or her hand between the gripping lever L and the opening section 2 in the direction of the arrow F. The hand is therefore positioned in the space ES. In this particular nonlimiting implementation of the gripping lever L, the lever L comprises a conductive element 3 which is, for example, a decorative chrome-plated element. In this case, the decorative conductive element is, for example, electrically floating, that is to say that it is not linked to the ground of the vehicle, and this makes it possible to reduce the manufacturing costs.

As can be seen in this nonlimiting embodiment, the first electrode E1 is adapted to be positioned facing the opening section 2, whereas a second electrode E2 is adapted to be positioned facing the conductive element 3.

To recap, the processing unit UT (not represented in this figure) of the sensor 1 is connected to the first electrode E1 and to the second electrodes E2 to detect their capacitance variations.

Following the detection, a triggering action on the opening section of the motor vehicle is triggered as a function of signatures of the capacitance variations of each of the two electrodes E1, E2 due to the approach of a hand in the two detection zones Z1, Z2.

The capacitance signatures of each of the electrodes E1, E2 are additional information items which will enable the processing unit UT to determine if it is a hand which is inserted into the handle L, or if it is raining.

In the case where a hand is inserted into the handle, the variations of capacitance of the electrodes E1, E2 are significant since the hand which is situated in the space ES stimulates the detection zone Z2 and the detection zone Z1 at the same time.

In the case where it is raining, the electrode E1 is not stimulated at the same time as the electrode E2 located facing the lateral part because the drop of rain is too small to stimulate both electrodes at the same time. The other second electrode which is located facing the bottom part is not stimulated. The variations of capacitance of the first electrode E1 and of this second electrode E2 are offset in time because the drop of rain falls either on the lateral part (top) of the gripping lever L, namely in the detection zone Z2, or inside the lever L, namely in the detection zone Z1. Moreover, it will be noted that, in the case where the rain runs along the gripping lever L, the variations of capacitance of the first electrode E1 are greater than those of the second electrodes E2 because, in a nonlimiting embodiment, the electrode E1 comprises a greater surface area than the electrodes E2. It will be recalled that the capacitance is proportional to the surface area.

Without a guard plane 13, when it rains, the variations of capacitance of the second electrodes E2 would be as great as those of the first electrode E1 and it would not be possible to differentiate the hand from the rain. When the hand is located outside the gripping lever, the variations of capacitance of the electrodes E1, E2 are less than those corresponding to a hand inserted into the lever L. The same applies, when there is a decorative chrome-plated element and if the hand touches it or approaches it (or any other object such as the body or a wall) without being inserted into the lever. In fact, since there is no longer spurious coupling between the electrode E1 and the electrodes E2 by virtue of the guard plane 13, by taking account of the measurement on the electrodes E2 and therefore the electrodes E2-chrome-plated element coupling, it is possible to deduce therefrom if there is a stimulus on the chrome-plated element only. In this case, the variations of capacitance of the electrodes E2 are smaller and different from those corresponding to a hand inserted into the lever L.

In the case where the two capacitance variation signatures are typical of a hand inserted into the lever L, then a locking or unlocking action is performed on the opening section of the vehicle. Conversely, in the case where the two capacitance variation signatures are typical of rain, or of a hand or any other object which is outside the lever L, then no locking or even unlocking action is performed.

In other words, the signatures make it possible to filter the unwanted phenomena such as the untimely unlocking of a door when the user is situated in proximity to the sensor 1 that is included in a vehicle but he or she has not moved his or her hand toward the sensor 1 and that it is raining or that he or she has simply placed his or her hand on or in front of the handle L.

Obviously, the description of the invention is not limited to the embodiments described above.

In another nonlimiting embodiment, the conductive element 3 is not positioned facing the second electrode E2, but is positioned on the outer face of the gripping lever L and facing the first electrode E1.

In another nonlimiting embodiment, the control unit UT comprises two connections respectively for the measurement input E and the control output S.

The invention is described in the above by way of nonlimiting example, and it is understood that the signatures described are nonlimiting and other types of signatures can be used without in any way departing from the scope of the invention.

Thus, the invention described notably offers the following advantages:
  it makes it possible to obviate any mechanical problem linked to a mechanical fixing of lateral and metallic electrodes. The lateral electrodes are replaced by tracks arranged on a plane parallel to the electrode E1;
  it makes it possible to reduce the volume of the presence sensor 1 by virtue of:
    the novel configuration (laid flat) of the electrodes E2 on the printed circuit 10;
    the guard plane 13 whose surfaces are printed on the printed circuit;
and thus to be adapted to the reduced dimensioning of a gripping lever L of a handle of an opening section 2
  it makes it possible to no longer have any spurious effect from the electrodes E2 on the low-frequency antenna, since the latter are no longer metallic or positioned facing the antenna;
  it reduces the cost and the complexity in manufacturing a presence sensor.

The invention claimed is:

1. A capacitive presence sensor capable of being arranged in the gripping lever of a handle of an opening section of a motor vehicle comprising:
  a first electrode for measuring capacitance defining a first detection zone and a second electrode for measuring capacitance defining a second detection zone;
  a so-called guard plane suitable for minimizing a capacitive coupling between said first electrode and said second electrode,
  said sensor being linked to a processing unit connected to said first electrode, to said second electrode and to the guard plane, said processing unit being suitable for periodically and alternately setting said guard plane at the same potential as said first electrode or at the same potential as said second electrode;
  a printed circuit comprising a first face and a second face, said first electrode comprising a surface which extends along said first face and said second electrode comprising a surface which extends along said second face; and
  the guard plane consists of a conductive track arranged between the first electrode and the second electrode passing through the thickness of said printed circuit and comprising a first printed surface extending along said first face of the printed circuit and a second printed surface extending along said second face of the printed circuit.

2. The capacitive presence sensor as claimed in claim 1, wherein the first surface of the conductive track is of a length at least equal to the length of said second electrode, and the second surface of the conductive track is of a length at least equal to the length of said first electrode.

3. The capacitive presence sensor as claimed in claim 1, further comprising a second second electrode arranged such that the two second electrodes are situated on either side of the first electrode on a plane at right angles to said presence sensor.

4. The capacitive presence sensor as claimed in claim 1, wherein the first electrode is offset relative to the second electrode (E2) on a plane at right angles to said printed circuit so as to obtain detection directions corresponding respectively to the first detection zone and to the second detection zone which are oblique.

5. The capacitive presence sensor as claimed in claim 1, wherein the first electrode is adapted to be positioned facing said opening section.

6. The capacitive presence sensor as claimed in claim 1, wherein the second electrode is adapted to be positioned facing a conductive element.

7. The capacitive presence sensor as claimed in claim 1, wherein the potential of the conductive track is set at the same level as that of the first electrode, or is set at the same level as that of the second electrode.

8. A handle of an opening section of a motor vehicle comprising:
  a gripping lever comprising a presence sensor arranged in said gripping lever, as claimed in claim 1.

* * * * *